United States Patent
Yun

(10) Patent No.: US 8,664,114 B2
(45) Date of Patent: Mar. 4, 2014

(54) IMAGE SENSOR AND METHOD FOR FABRICATING THE SAME

(71) Applicant: Dongbu HiTek Co., Ltd., Seoul (KR)

(72) Inventor: Ki-Jun Yun, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 13/742,714

(22) Filed: Jan. 16, 2013

(65) Prior Publication Data

US 2013/0307035 A1    Nov. 21, 2013

(30) Foreign Application Priority Data

May 16, 2012  (KR) .......................... 10-2012-0052101

(51) Int. Cl.
*H01L 21/4763* (2006.01)
(52) U.S. Cl.
USPC ........... 438/637; 438/639; 438/640; 438/672; 257/774; 257/E21.577; 257/E21.578; 257/E21.585
(58) Field of Classification Search
USPC ........... 257/774, E21.577, E21.578, E21.585; 438/637, 639, 640, 672
See application file for complete search history.

(56) References Cited

U.S. PATENT DOCUMENTS

2004/0173874 A1*  9/2004  Saigoh .......................... 257/535

* cited by examiner

*Primary Examiner* — Tan N Tran
(74) *Attorney, Agent, or Firm* — Sherr & Jiang, PLLC

(57) ABSTRACT

A method for fabricating an image sensor includes at least one of: (1) Forming a gate on a semiconductor substrate; (2) Forming spacers on both side walls of the gate and forming a dummy pattern on an upper portion of the semiconductor substrate; and (3) Forming a metal pad for an electrical connection on an upper portion of the dummy pattern. The method may include at least one of: (1) Forming an interlayer dielectric layer covering the entire semiconductor substrate, (2) Etching portions of the interlayer dielectric layer and the semiconductor substrate to form a super-contact hole; and (3) forming an insulation film on the entire surface of the interlayer dielectric layer. The method may include forming normal contact holes such that a portion of an upper portion of the gate and a partial region of the metal pad for an electrical connection are exposed and filling up the normal contact holes with a conductive material to form normal contacts.

14 Claims, 4 Drawing Sheets

IMAGE SENSOR AND METHOD FOR FABRICATING THE SAME

The present application claims priority to Korean Patent Application No. 10-2012-0052101 (filed on May 16, 2012), which is hereby incorporated by reference in its entirety.

BACKGROUND

There has been a general trend in the reduction in size of micro-electronic systems. Chip scale packaging, flip chips, and multichip modules are generally applied to a variety of electronic product categories such as mobile phones, handheld computers, chip cards, and similar applications/devices. Future applications of electronic devices may require relatively complicated elements supporting various functions, which often results in the chip area being required to be relatively large to meet demands. This results in challenges with manufacturing yield of chips due to an integration of multifunctional devices, an increase in cost due to complexity of device implementation, and technical limitations. In addition, wirings between subsystems may be challenging due to limitations in performance, multifunctionality, reliability and similar issues of micro-electronic systems. These factors may be critical performance bottlenecks for future integrated circuit generation. A 3D integration technology may have significant potential to replace an embedded system on chip (SoC) technology.

In a packaging process, a super-contact hole may serve as a pad and a normal contact hole may serve for connecting wirings that are simultaneously patterned on a single wafer. The super-contact hole may have a diameter ranging from approximately 1 μm to 2 μm and a depth ranging from approximately 6 μm to 10 μm. A non-super-contact hole may have a diameter ranging from approximately 0.1 μm to 0.3 μm and a depth ranging from approximately 1 μm to 2 μm.

A process of forming a related art super-contact can be described with reference to FIGS. 1A to 1E. Example FIGS. 1A to 1E are cross-sectional views illustrating a process of forming a super-contact, according to the related art. As shown in example FIG. 1A, an device isolation layer (not shown) may define an active region. Unit elements (such as a PMOS transistor and an NMOS transistor including a source/drain junction part and a gate 50 formed on the active region and similar elements) may be formed on a semiconductor substrate 100.

Figure 1A:
Figure 1B:
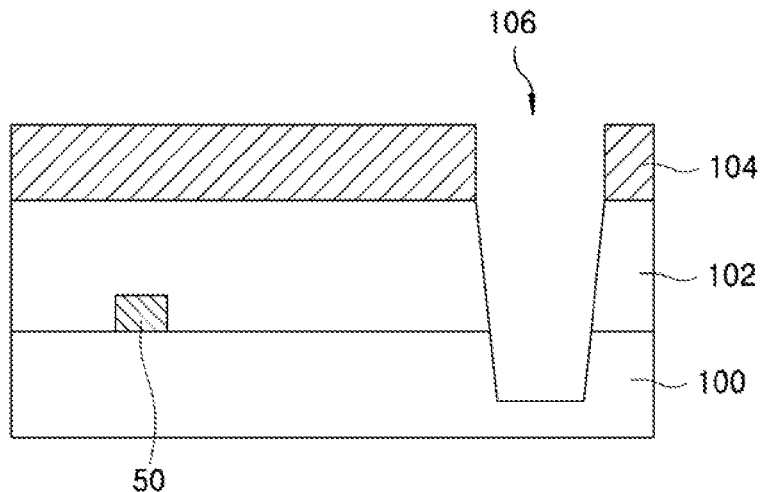

As shown in FIG. 1B, an interlayer dielectric layer 102 may be formed on the entire structure with the unit elements formed thereon. A photoresist pattern 104 for a super-contact hole may be formed on the interlayer dielectric layer 102. Then the interlayer dielectric layer 102 and the semiconductor substrate 100 may be etched by an etching process using the photoresist pattern 104 as an etching mask to form a super-contact hole 106.

Figure 1C:
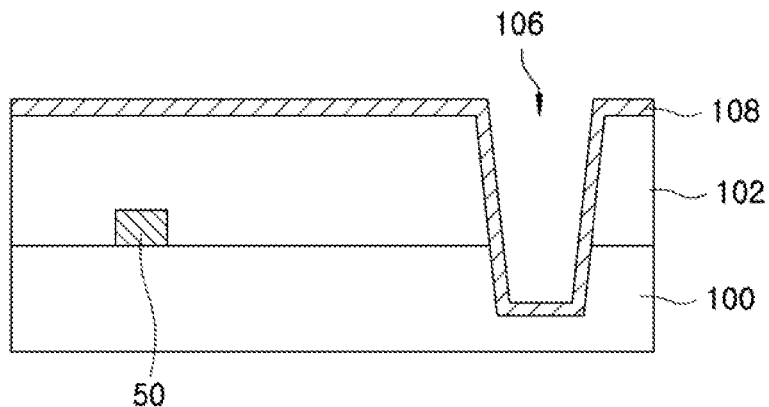

As shown in FIG. 1C, the photoresist pattern 104 may be removed through a strip process, and an insulation film 108 may be formed on the surface of the entire structure including the super-contact hole 106. The insulation film 108 may serve as a shielding insulation film of a super-contact to be formed later and may be formed of at least one of oxide series and nitride series.

Figure 1D:
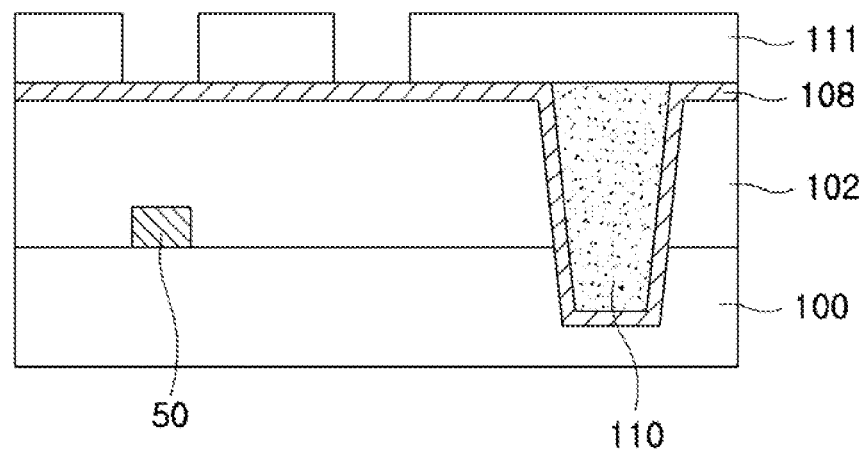
Figure 1E:
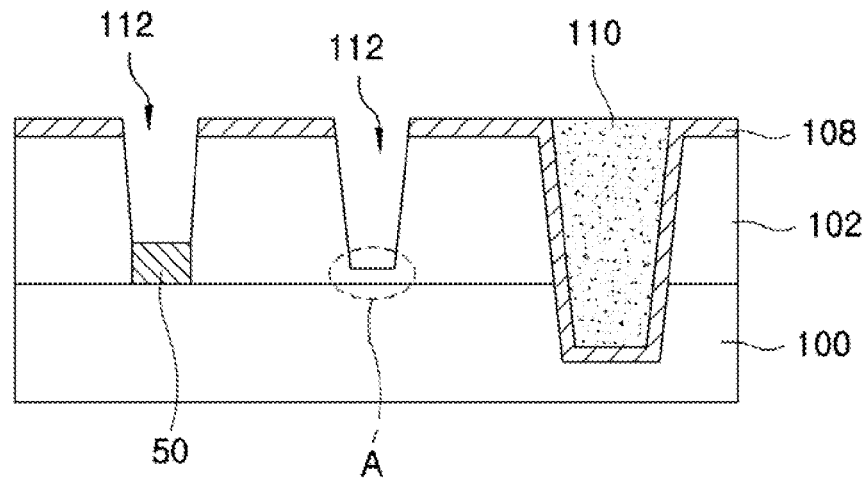

As shown in FIG. 1D, the super-contact hole 106 may be filled with a conductive material (e.g. tungsten (W)) to form a conductive layer 110. As shown in FIGS. 1D and 1E, a photoresist pattern 111 for a normal contact hole may be formed on an upper portion of the entire structure with the conductive layer 110 filled in the super-contact hole 106. The interlayer dielectric layer 102 may be etched through an etching process using the photoresist pattern 111 as an etching mask to form a normal contact hole 112. The photoresist pattern 111 for a normal contact is removed.

In the foregoing related art super-contact hole formation process, the insulation film 108 is formed after the formation of the super contact hole 106. However, the interlayer dielectric layer 102 may not be etched enough when forming the normal contact hole 112, which may cause problems with an electrical connection to the active region. For example, when the normal contact hole 112 is formed, since the interlayer dielectric layer 102 needs to be etched deeper due to the insulation film 108, a portion A in the interlayer dielectric layer 102 may not be etched enough, which may cause problems in the electrical connection to the active region.

SUMMARY

In view of the above, embodiments provides an image sensor in which problems of electrical connections does not arise or are minimized without changing the etching depth in an interlayer dielectric layer when forming a normal contact hole. Embodiments relate to a method for fabricating the same.

In accordance with embodiments, a method for fabricating an image sensor includes at least one of the following: (1) Forming a gate on a semiconductor substrate. (2) Forming spacers on both side walls of the gate and forming a dummy pattern spaced apart from the gate on an upper portion of the semiconductor substrate. (3) Forming a metal pad for an electrical connection on an upper portion of the dummy pattern. (4) Forming an interlayer dielectric layer covering substantially the entire semiconductor substrate having the metal pad for an electrical connection formed thereon. (5) Etching portions of the interlayer dielectric layer and the semiconductor substrate to form a super-contact hole. (6) Forming an insulation film on the entire surface of the interlayer dielectric layer having the super-contact hole formed thereon. (7) Forming normal contact holes such that a portion of an upper portion of the gate and a partial region of the metal pad for an electrical connection are exposed therefrom. (8) Filling the normal contact holes with a conductive material to form normal contacts.

In embodiments, the semiconductor substrate may be an epitaxial layer. In embodiments, said forming a metal pad for an electrical connection may include forming a metal pad for an electrical connection that covers the entirety or a portion of the upper portion of the dummy pattern. In embodiments, said forming a dummy pattern may include forming an oxide film for a spacer on an upper portion of the semiconductor substrate having the gate formed thereon and patterning a portion of the oxide film for a spacer to form the spacers and the dummy pattern spaced apart from the gate on an upper portion of the semiconductor substrate.

In embodiments, said forming a metal pad for an electrical connection may include depositing a metal material on the entire surface of the semiconductor substrate with the dummy pattern formed thereon and patterning the deposited metal material to form the metal pad for an electrical connection covering a partial region of an upper portion of the dummy pattern and a partial upper portion of the semiconductor substrate adjacent to the dummy pattern. In embodiments, the insulation film may be formed by using a silicon nitride film or a silicon oxide film.

Embodiments relate to an image sensor including at least one of: (1) A gate formed on a semiconductor substrate and spacers formed on both side walls of the gate. (2) A dummy pattern formed spaced apart from the gate on an upper portion of the semiconductor substrate. (3) A metal pad for an electrical connection, which is configured to cover an upper portion of dummy pattern. (4) An interlayer dielectric layer substantially covering the entire semiconductor substrate having the gate and the metal pad for an electrical connection formed thereon. (5) Normal contacts formed to be connected to a portion of an upper portion of the gate and a partial region of the metal pad for an electrical connection. (6) A super-contact configured formed by etching portions of the interlayer dielectric layer and the semiconductor substrate.

In embodiments, the dummy pattern may be formed by patterning a portion of an oxide film deposited to form the spacers. In embodiments, the metal pad for an electrical connection may be formed to have a structure that covers a portion of an upper portion of the dummy pattern and a partial upper portion of the semiconductor substrate adjacent to the dummy pattern. In embodiments, the metal pad for an electrical connection may be formed to have a structure that covers the entirety or a portion of the upper portion of the dummy pattern.

In accordance with embodiments, after the dummy pattern and the metal pad for an electrical connection are formed on the semiconductor substrate, the process for forming the super-contact hole and the normal contact hole may be performed. In embodiments, although the thickness of the interlayer dielectric layer is relatively large due to the insulation film formed on the super-contact hole, since the interlayer dielectric layer is etched only up to an upper portion of the metal pad for an electrical connection, the normal contact hole without the problem of an electrical connection may be formed without changing an etching depth.

DRAWINGS

The objects and features of embodiments will become apparent from the following description of embodiments, given in conjunction with the accompanying drawings, in which:

Example FIGS. 1A to 1E are cross sectional views illustrating a process of forming a contact in accordance with the related art.

Example FIGS. 2A to 2F are cross sectional views illustrating a process of forming a contact of a CMOS image sensor in accordance with embodiments.

DESCRIPTION

Advantages and features of embodiments and methods of accomplishing the same may be understood more readily by reference to the following detailed description of embodiments and the accompanying drawings. The embodiments may, however, be embodied in many different forms and should not be construed as being limited to the embodiments set forth herein. Rather, these embodiments are provided so that this disclosure will be thorough and complete and will fully convey the concept of the embodiments to those skilled in the art, and the embodiments will only be defined by the appended claims.

Hereinafter, a contact of a CMOS image sensor and a formation process thereof in accordance with embodiments will be described with reference to the accompanying drawings. Example FIGS. 2A to 2F are cross sectional views illustrating a process of forming a contact of a CMOS image sensor, in accordance with embodiments.

Figure 2A:
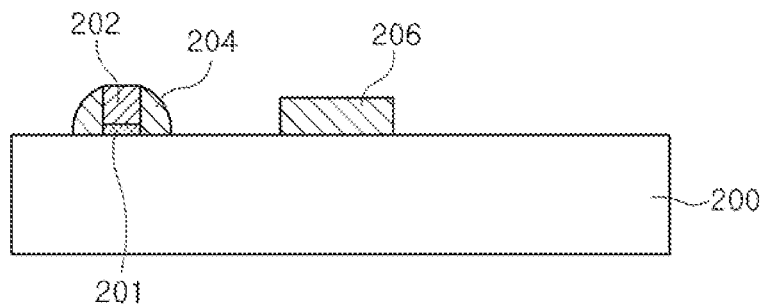

As illustrated in FIG. 2A, an insulation layer and a polysilicon layer may be sequentially formed on an upper portion of a semiconductor substrate 200 and then patterned to form a gate insulation film 201 and a gate 202, in accordance with embodiments. An oxide film for a spacer may then be formed on/over substantially the entire surface having the gate 202 formed thereon and then patterned to form a spacer 204 at both side walls of the gate 202 and a dummy pattern 206 spaced apart from the spacer 204 on an upper portion of the semiconductor substrate 200, in accordance with embodiments. In embodiments, the dummy pattern 206 is a portion connected to a normal contact hole (to be formed later) and the semiconductor substrate 200 may be an epitaxial layer formed through a silicon growth process.

Figure 2B:
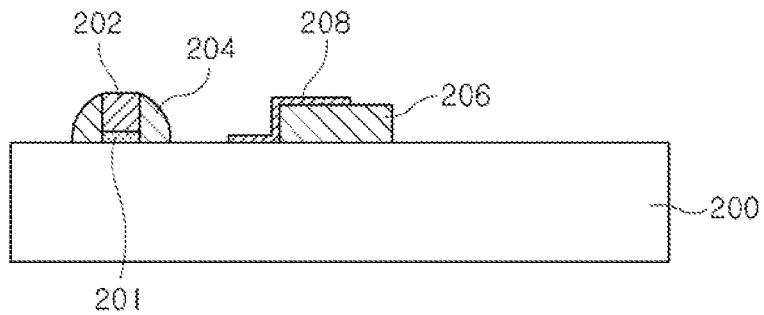

In embodiments, as illustrated in FIG. 2B, a barrier metal material for an electrical connection may be deposited and then patterned to form a metal pad 208 for an electrical connection on a partial region of an upper portion of the dummy pattern 206. In embodiments, the metal pad 208 for the electrical connection may be formed to cover the partial region of the upper portion or the entire region of the dummy pattern 206 or a partial region of the upper portion of the semiconductor substrate 200 adjacent to the dummy pattern 206.

Figure 2C:
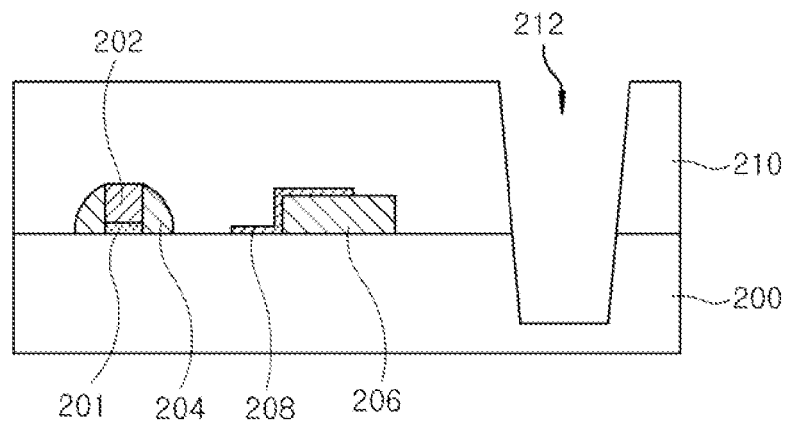

As illustrated in FIG. 2C, an interlayer dielectric layer 210 may be formed on the entire structure on/over the metal pad 208 for an electrical connection. A photoresist pattern (not shown) for a super-contact hole may be formed on an upper portion of the interlayer dielectric layer 210. In embodiments, the interlayer dielectric layer 210 and the semiconductor substrate 200 may be etched through an etching process using the photoresist pattern as an etch mask to from a super-contact hole 212.

Figure 2D:
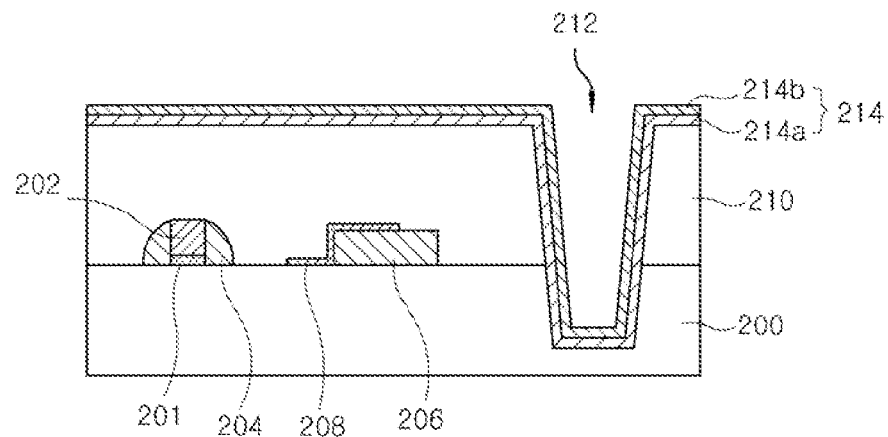

As illustrated in FIG. 2D, the photoresist pattern may be removed through a strip process, in accordance with embodiments. In embodiments, an insulation film 214 may be formed on/over the surface of the entire structure including the super-contact hole 212. In embodiments, the insulation film 214 may be formed of at least one of oxide series and nitride groups. In example embodiments, the insulation film 214 may be formed by sequentially depositing a silicon nitride film 214a and a silicon oxide film 214b.

Figure 2E:
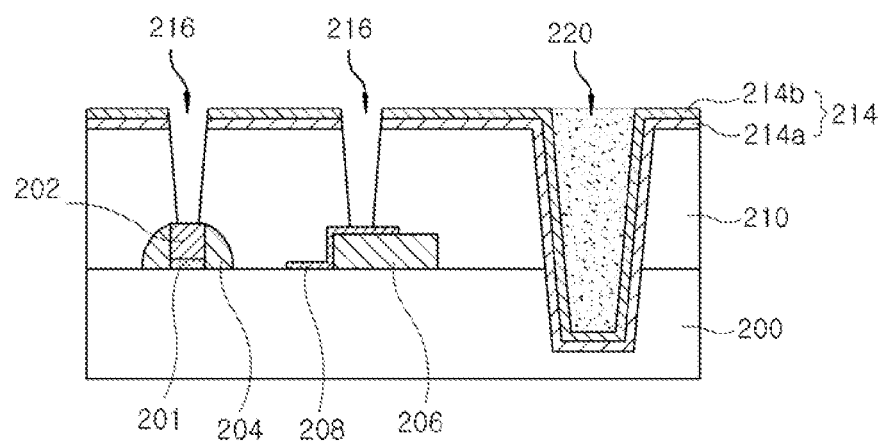

In embodiments, as shown in FIG. 2E, the super-contact hole 212 may be filled with a conductive material (e.g. tungsten (W)), to form a super-contact 220. In embodiments, a photoresist pattern for a normal contact hole may be formed on the entire structure with the super-contact 220 formed thereon. In embodiments, the interlayer dielectric layer 210 may be etched through an etching process using the photoresist pattern as an etch mask to form normal contact holes 216. In embodiments, the photoresist pattern for a normal contact hole and the photoresist layer for filling-up are all removed through a strip process, thus completing the super-contact 220 and the normal contact holes 216. In embodiments, the normal contact holes 216 may be formed to allow a partial upper portion of the metal pad 208 for an electrical connection and an upper portion of the gate 202 to be exposed therefrom.

Figure 2F:
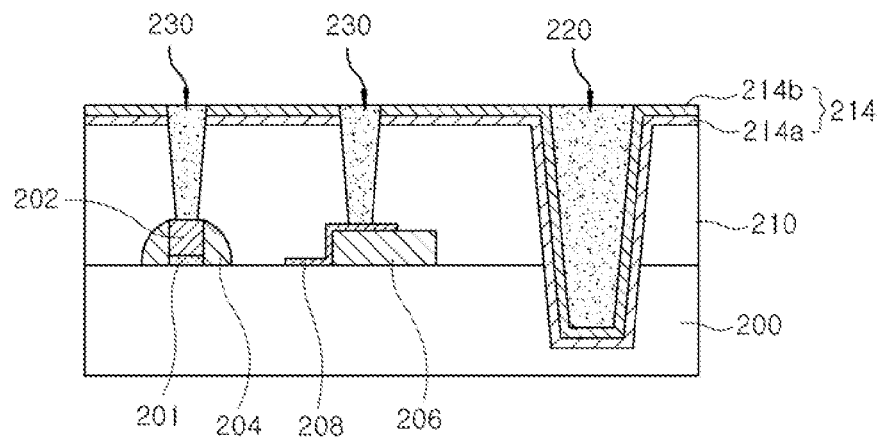

In embodiments, as shown in FIG. 2F, a conductive material (e.g., tungsten (W)) may be deposited such that the normal contact holes 216 are completely filled up. A chemical mechanical polishing (CMP) process may be performed by setting an upper portion of the insulation film 214 as a polishing stop point, to form normal contacts 230, in accordance with embodiments.

In embodiments, after the dummy pattern 206 and the metal pad 208 for an electrical connection are formed on the semiconductor substrate 200, the process of forming the super-contact hole 212 and the normal contact hole 216 is performed. In embodiments, although the etching thickness for forming the normal contact holes 216 (i.e. the thickness obtained by adding each thickness of the insulation film 214 and the interlayer dielectric layer 210), is increased, since the interlayer dielectric layer 210 is etched only up to the upper portion of the metal pad 208 for an electrical connection, which may result in normal contact holes 216 that do not have electrical connection problems.

While the embodiments have been shown and described with respect to the embodiments, the embodiments are not limited thereto. It will be understood by those skilled in the art that various changes and modifications may be made without departing from the scope of the embodiments as defined in the following claims.

What is claimed is:

1. A method comprising:
   forming a gate on a semiconductor substrate;
   on an upper portion of the semiconductor substrate, forming spacers on both side walls of the gate and forming a dummy pattern spaced apart from the gate;
   forming a metal pad configured to provide an electrical connection on an upper portion of the dummy pattern;
   forming an interlayer dielectric layer at least one of on and over the entire semiconductor substrate and the metal pad;
   etching portions of the interlayer dielectric layer and the semiconductor substrate to form a super-contact hole;
   forming an insulation film on the entire surface of the interlayer dielectric layer and the super-contact hole;
   forming normal contact holes exposing at least a portion of an upper portion of the gate and at least a partial portion of the metal pad; and
   filling the normal contact holes with a conductive material to form normal contacts.

2. The method of claim 1, wherein the method is a method of fabricating an image sensor.

3. The method of claim 1, wherein the semiconductor substrate is an epitaxial layer.

4. The method of claim 1, wherein the metal pad covers at least a portion of the upper portion of the dummy pattern.

5. The method of claim 1, wherein the metal pad covers the entire upper portion of the dummy pattern.

6. The method of claim 1, wherein said forming a dummy pattern comprises:
   forming an oxide film over an upper portion of the semiconductor substrate having the gate formed thereon; and
   patterning a portion of the oxide film to form the spacers and the dummy pattern spaced apart from the gate on an upper portion of the semiconductor substrate.

7. The method of claim 1, wherein said forming a metal pad comprises:
   depositing a metal material on the entire surface of the semiconductor substrate with the dummy pattern formed thereon; and
   patterning the deposited metal material to form the metal pad covering a partial region of an upper portion of the dummy pattern and a partial upper portion of the semiconductor substrate adjacent to the dummy pattern.

8. The method of claim 1, wherein the insulation film is formed by using a silicon nitride film or a silicon oxide film.

9. An apparatus comprising:
   a gate formed on a semiconductor substrate and spacers formed on both side walls of the gate;
   a dummy pattern formed spaced apart from the gate on an upper portion of the semiconductor substrate;
   a metal pad covering an upper portion of dummy pattern, wherein the metal pad is configured for electrical connection;
   an interlayer dielectric layer covering the entire semiconductor substrate having the gate and the metal pad for an electrical connection formed thereon;
   normal contacts formed to be connected to a portion of an upper portion of the gate and a partial region of the metal pad for an electrical connection; and
   a super-contact formed by etching portions of the interlayer dielectric layer and the semiconductor substrate.

10. The apparatus of claim 9, wherein the apparatus is an image sensor.

11. The apparatus of claim 9, wherein the dummy pattern is formed by patterning a portion of an oxide film deposited to form the spacers.

12. The apparatus of claim 9, wherein the metal pad is formed to have a structure that covers a portion of an upper portion of the dummy pattern and a partial upper portion of the semiconductor substrate adjacent to the dummy pattern.

13. The apparatus of claim 9, wherein the metal pad covers the entire upper portion of the dummy pattern.

14. The apparatus of claim 9, wherein the metal pad covers a portion of the upper portion of the dummy pattern.

* * * * *